US007375968B2

(12) United States Patent
Liao

(10) Patent No.: US 7,375,968 B2
(45) Date of Patent: May 20, 2008

(54) DESK LAMP

(76) Inventor: Yung-Chiang Liao, 2F-6, No. 128, Sec. 2, Dunhua S. Rd., Da-an District, Taipei City 106 (TW)

(*) Notice: Subject to any disclaimer, the term of this patent is extended or adjusted under 35 U.S.C. 154(b) by 191 days.

(21) Appl. No.: 11/257,987

(22) Filed: Oct. 26, 2005

(65) Prior Publication Data

US 2007/0091562 A1 Apr. 26, 2007

(51) Int. Cl.
*H05K 7/20* (2006.01)
*F21V 29/00* (2006.01)
*B60Q 1/06* (2006.01)

(52) U.S. Cl. ...................... 361/709; 361/690; 361/697; 362/294; 362/373

(58) Field of Classification Search ........ 361/688–690, 361/692, 694–697, 701–704, 707, 709–711, 361/714; 174/15.2; 62/259.2; 439/485, 439/487; 312/223.5; 362/294, 373; 352/800; 165/80.3

See application file for complete search history.

(56) References Cited

U.S. PATENT DOCUMENTS

| | | | | |
|---|---|---|---|---|
| 3,388,249 | A * | 6/1968 | Orbach et al. | 362/269 |
| 5,339,233 | A * | 8/1994 | Yang | 362/402 |
| 6,565,234 | B1 * | 5/2003 | Skegin et al. | 362/294 |
| 2002/0191396 | A1 * | 12/2002 | Reiff et al. | 362/246 |
| 2004/0165379 | A1 * | 8/2004 | Waters | 362/231 |
| 2004/0228124 | A1 * | 11/2004 | Reiff et al. | 362/184 |
| 2005/0152135 | A1 * | 7/2005 | Cai | 362/167 |
| 2006/0029902 | A1 * | 2/2006 | Rose et al. | 433/29 |
| 2006/0072328 | A1 * | 4/2006 | Chan | 362/382 |
| 2006/0262523 | A1 * | 9/2006 | Schaak | 362/86 |
| 2007/0030672 | A1 * | 11/2006 | Smith et al. | 362/157 |
| 2007/0091622 | A1 * | 2/2007 | Offiler et al. | 362/198 |

* cited by examiner

*Primary Examiner*—Anatoly Vortman
*Assistant Examiner*—Bradley H Thomas
(74) *Attorney, Agent, or Firm*—Rosenberg, Klein & Lee

(57) ABSTRACT

An improved desk lamp is disclosed. The improved desk lamp of the present invention comprises a heat dissipating housing, a heat dissipating module, a light unit and a control unit. The heat dissipating module, light unit and control unit are disposed inside the housing. A window is provided at an upper portion on the inner side of the housing. The light unit is disposed on a heat conducting plate of the heat dissipating module and is aligned with the window so that the light radiating from the light unit may go through the window to provide illumination. The heat dissipating module is in contact with an inner wall of the housing. The control unit is connected with the light unit and has a switch, which extends out of the housing and may be used to turn on and turn off the light unit. When the light unit is turned on, the heat generated by the light unit may be absorbed by the heat dissipating module and then be transmitted to the heat dissipating housing so that the heat may be quickly dissipated into the ambient surrounding by the housing.

9 Claims, 4 Drawing Sheets

DESK LAMP

BACKGROUND OF THE INVENTION

1. Field of the Invention

The invention generally relates to an improved desk lamp. More particularly, the invention relates to an improved desk lamp that the heat generated by the light unit may be swiftly dissipated out of the housing by its heat dissipating housing and heat dissipating module so that the light unit may have a longer service life.

2. Description of the Prior Art

Desk lamps have been used for desks, offices and studies so as to provide illumination for reading or other purposes and so that our eyesight would not be weakened by the insufficiency of illumination. Hence, desk lamp is a useful device.

However, the desk lamps of the prior art have the following disadvantages:

1. Most of the desk lamps of the prior art use incandescent bulbs, mercury lights, sodium lights, etc. and hence they have a relatively lower degree of efficiency in terms of the energy conversion from power to light and consume relatively more power.

2. The desk lamps of the prior art do not have any heat dissipating device so that the heat generated by a bulb or a light can not be dissipated quickly and hence such bulb or light has a shorter service life.

Therefore, we can see that the desk lamps of the prior art have many disadvantages and need to be improved.

To eliminate the disadvantages of the prior art, the inventor has put in a lot of effort in the subject and has successfully come up with the improved desk lamp of the present invention.

SUMMARY OF THE INVENTION

A first object of the present invention is to provide an improved desk lamp that the heat generated by the light unit may be absorbed by the heat dissipating module and then be transmitted to the heat dissipating housing so that the heat may be swiftly dissipated to the ambient surrounding by the housing.

Another object of the present invention is to provide an improved desk lamp in which the light unit comprises several LEDs (light emitting diodes) so that the light unit may have a high level of brightness, a high degree of electric efficiency and a longer service life.

A third object of the present invention is to provide an improved desk lamp that is structurally simple and easy to assemble and has a high degree of usefulness.

The improved desk lamp of the present invention comprises a heat dissipating housing, a heat dissipating module, a light unit and a control unit. The heat dissipating module, light unit and control unit are disposed inside the housing. The heat dissipating housing is made of a material with a high degree of heat conductivity. A window is provided at an upper portion on the inner side of the housing. The light unit is disposed on a heat conducting plate of the heat dissipating module and is aligned with the window. The heat dissipating module is in contact with an inner wall of the housing. The control unit is connected with the light unit and has a switch, which extends out of the housing and may be used to turn on and turn off the light unit. When the light unit is turned on, light may pass through the window to provide illumination and the heat generated by the light unit may be absorbed by the heat dissipating module and then be transmitted to the heat dissipating housing so that the heat may be swiftly dissipated to the ambient surrounding by the housing.

These features and advantages of the present invention will be fully understood and appreciated from the following detailed description of the accompanying Drawings.

DETAILED DESCRIPTION OF THE PREFERRED EMBODIMENTS

Figure 1:
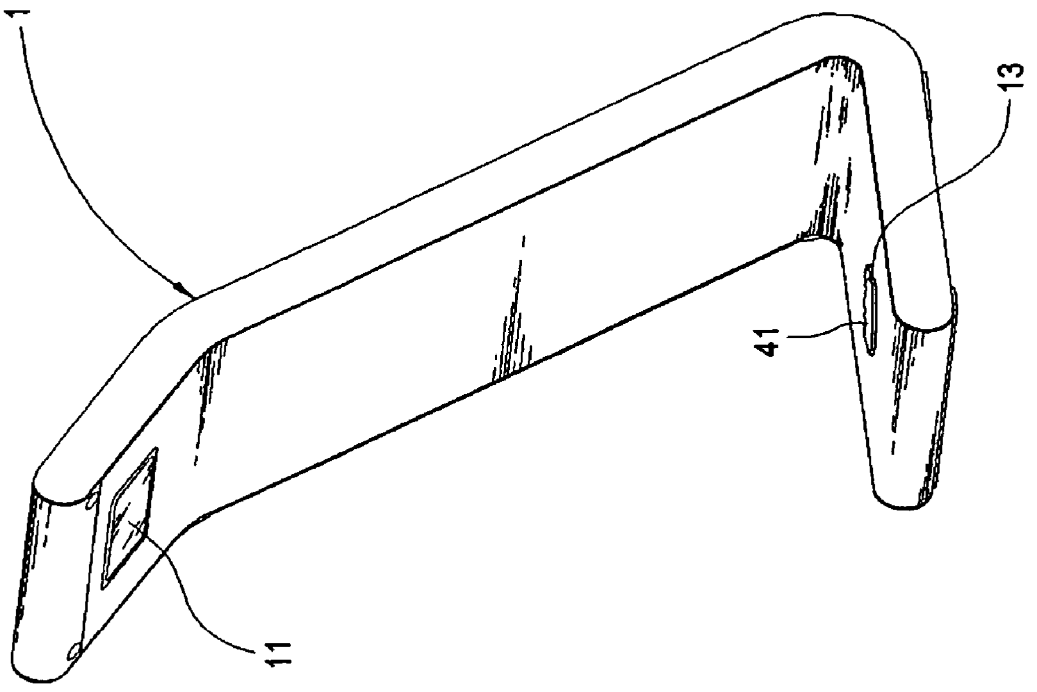
FIG. 1 is a perspective view showing the improved desk lamp of the present invention.
Figure 2:
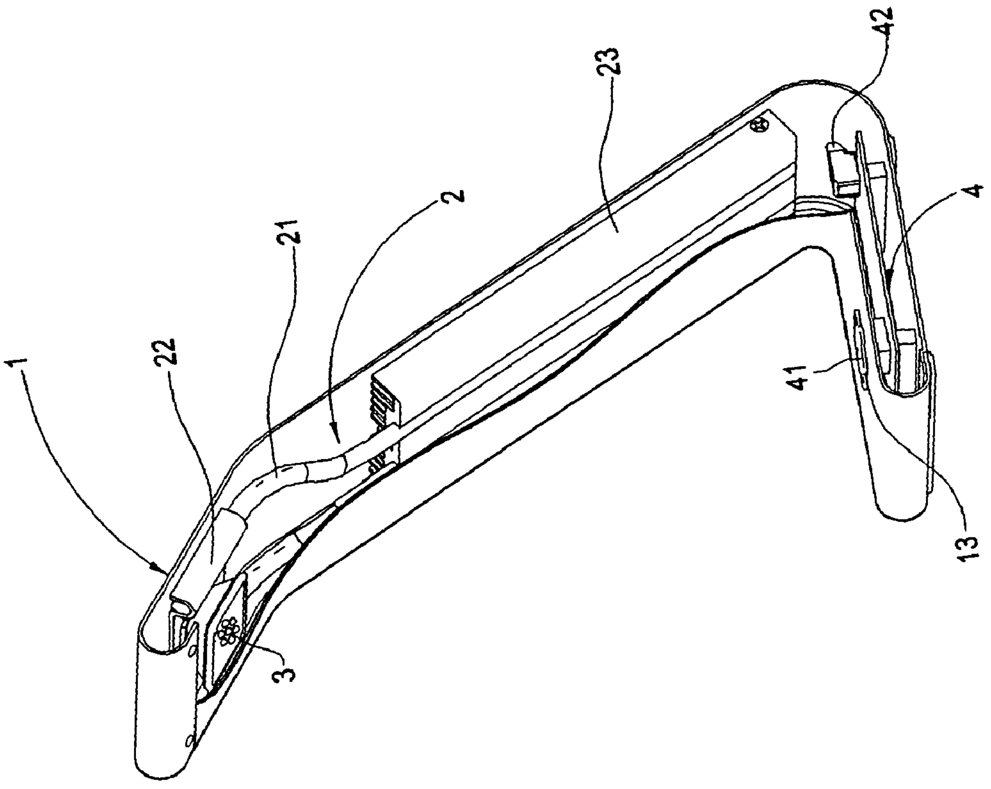
FIG. 2 is an exploded view showing the inner side of the improved desk lamp of the present invention.
Figure 3:
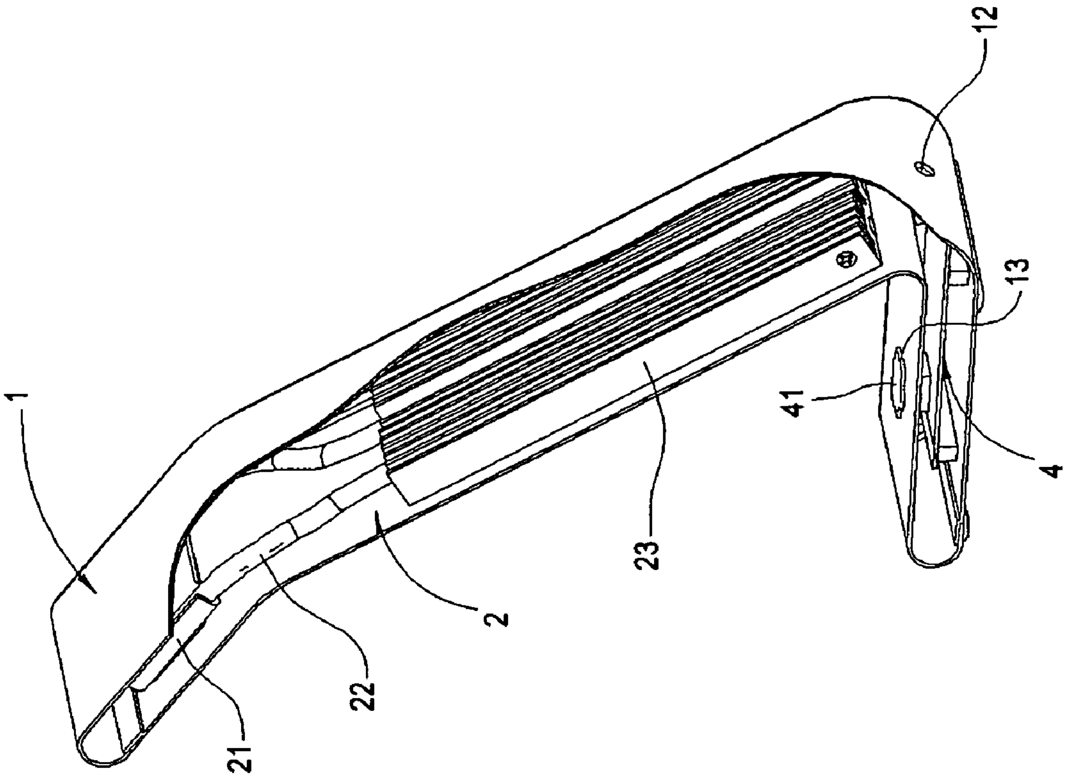
FIG. 3 is an exploded view showing the outer side of the improved desk lamp of the present invention.

Referring to FIGS. 1, 2 and 3, the improved desk lamp of the present invention comprises a heat dissipating housing 1, a heat dissipating module 2, a light unit 3 and a control unit 4.

The heat dissipating housing 1 is made of a material with a high degree of heat conductivity and may have various shapes. A space is provided within the housing 1. A window 11 is provided at an upper portion on the inner side of the housing 1. Also, an opening 13 and a hole 12 are provided on the housing 1.

The heat dissipating module 2 includes a heat conducting plate 21, at least a heat conducting tube 22 and at least a heat dissipating fin 23. The heat conducting plate 21 is connected with the heat dissipating fin 23 by the heat conducting tube 22. The heat dissipating module 2 is held in the space provided within the housing 1. The heat conducting plate 21 is aligned with the window 11, and the heat dissipating fin 23 is in contact with the inner wall on the inner side of the housing 1.

The light unit 3 is disposed on the heat conducting plate 21 of the heat dissipating module 2. The light unit 3 is aligned with the window 11 so that the light sent from the light unit 3 may go through the window 11 to provide illumination. The light unit 3 comprises several LEDs (light emitting diodes) or other type of lights with a high level of brightness, a high degree of electric efficiency and a long service life.

The control unit 4 at least includes a switch 41 and a wire retaining element 42. The control unit 4 is disposed inside the housing 1, and the switch 41 extends out of the housing 1 through the opening 13. The wire retaining element 42 is aligned with the hole 12 of the housing 1 so that an electric wire may pass through the hole 12 and the wire retaining element 42 and reach the switch 41. Also, the switch 41 is connected with the light unit 3 so that electricity may be fed to the light unit 3. The switch 41 may be used to turn on and turn off the light unit 3.

Figure 4:
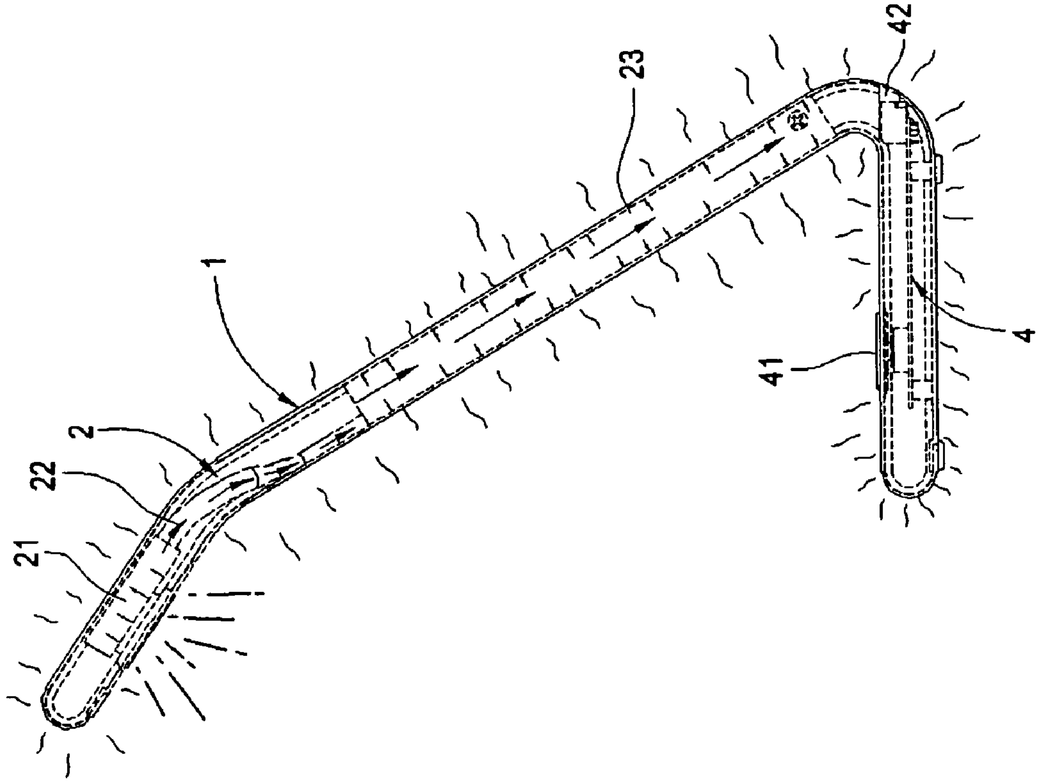
FIG. 4 is a side view showing the improved desk lamp of the present invention in use.

FIG. 4 is a side view showing the improved desk lamp of the present invention in use. Because electricity is fed through the wire retaining element 42 to the switch 41, a user may use the switch 41 to turn on and off the light unit 3. When the light unit 3 is turned on and radiates light, light may go through the window 11 to provide illumination. The heat generated by the light unit 3 is absorbed by the heat conducting plate 21 and then is passed on through the heat conducting tube 22 to the heat dissipating fin 23; then, the heat is transmitted to the heat dissipating housing 1 so that the heat may be quickly dissipated into the ambient surrounding and that the light unit 3 may have a longer service life.

Optionally, to increase the heat dissipating rate, at least a fan (not shown) may be provided on the heat dissipating module 2 and an opening aligned with the fan is provided on the housing 1 so that air and heat may be let out of the housing 1 through the opening.

In contrast to the prior art desk lamps, the improved desk lamp of the present invention has the following advantages:

1. In the improved desk lamp of the present invention, a heat dissipating module is used to absorb the heat generated by the light unit, and then the heat is transmitted to the heat dissipating housing so that the heat may be quickly dissipated into the ambient surrounding by the housing.
2. The light unit comprises several LEDs (light emitting diodes) so that the light unit has a high level of brightness, a high degree of electric efficiency and a longer service life.
3. The improved desk lamp of the present invention is structurally simple and easy to assemble and has a high degree of usefulness.

Although a preferred embodiment of the present invention have been described in detail hereinabove, it should be understood that the preferred embodiment is to be regarded in an illustrative manner rather than a restrictive manner, and many variations and modifications of the basic inventive concepts herein taught still fall within the scope of the present invention.

From the above, we can see that this invention is innovative in terms of design and has more functional advantages that the prior art desk lamps do not have. It is hoped that this patent application will be approved.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. An improved desk lamp, comprising:

a heat dissipating housing, a space being provided within the heat dissipating housing and a window being provided at an upper portion on an inner side of the heat dissipating housing;

a heat dissipating module, held in the space provided within the heat dissipating housing and in contact with an inner wall of the heat dissipating housing;

the heat dissipating module includes a heat conducting plate, at least a heat conducting tube and at least a heat dissipating fin, and wherein the heat conducting plate is connected with the heat dissipating fin by the heat conducting tube and the heat conducting plate is aligned with the window so that a light unit may be disposed on the heat conducting plate of the heat dissipating module, and wherein the heat dissipating fin is in contact with the heat dissipating housing;

the light unit, disposed on the heat conducting plate of the heat dissipating module, is aligned with the window so that the light radiating from the light unit may go through the window to provide illumination;

a switch, able be used to turn on and turn off the light unit, wherein the heat generated by the light unit may be absorbed by the heat dissipating module and then be transmitted to the heat dissipating housing so that the heat may be quickly dissipated into the ambient surrounding by the heat dissipating housing.

2. The improved desk lamp as in claim 1, wherein an opening is provided on the heat dissipating housing so that the switch may extend out of the heat dissipating housing through a first opening.

3. The improved desk lamp as in claim 1, wherein the light unit comprises several LEDs (light emitting diodes) or other type of lights with a high level of brightness, a high degree of electric efficiency and a long service life.

4. The improved desk lamp as in claim 1, wherein a fan may be optionally provided on the heat dissipating module and an additional opening aligned with the fan is provided on the heat dissipating housing so that air and heat may be let out of the heat dissipating housing through the additional opening.

5. An improved desk lamp, comprising:

a heat dissipating housing, a space being provided within the heat dissipating housing and a window being provided at an upper portion on an inner side of the heat dissipating housing;

a heat dissipating module, held in the space provided within the heat dissipating housing and in contact with an inner wall of the heat dissipating housing;

a light unit, disposed on a heat conducting plate of the heat dissipating module and aligned with the window so that the light radiating from the light unit may go through the window to provide illumination;

the heat dissipating module includes the heat conducting plate, at least a heat conducting tube and at least a heat dissipating fin, and wherein the heat conducting plate is connected with the heat dissipating fin by the heat conducting tube and the heat conducting plate is aligned with the window so that the light unit may be disposed on the heat conducting plate of the heat dissipating module, and wherein the heat dissipating fin is in contact with the heat dissipating housing;

a control unit, disposed inside the heat dissipating housing, connected with the light unit and having a switch, which may be used to turn on and turn off the light unit, wherein the heat generated by the light unit may be absorbed by the heat dissipating module and then be transmitted to the heat dissipating housing so that the heat may be quickly dissipated into the ambient surrounding by the heat dissipating housing.

6. The improved desk lamp as in claim 5, wherein an opening is provided on the heat dissipating housing so that the switch may extend out of the heat dissipating housing through a first opening.

7. The improved desk lamp as in claim 5, wherein the light unit comprises several LEDs (light emitting diodes) or other type of lights with a high level of brightness, a high degree of electric efficiency and a long service life.

8. The improved desk lamp as in claim 5, wherein the control unit includes a wire retaining element and a hole is provided on the heat dissipating housing, and wherein the wire retaining element is aligned with the hole so that an electric wire may pass through the hole and the wire retaining element and reach the switch.

9. The improved desk lamp as in claim 5, wherein a fan may be optionally provided on the heat dissipating module and an additional opening aligned with the fan is provided on the heat dissipating housing so that air and heat may be let out of the heat dissipating housing through the additional opening.

* * * * *